United States Patent [19]

Boswell

[11] Patent Number: 5,643,678
[45] Date of Patent: Jul. 1, 1997

[54] HOLOGRAPHIC FILM AND METHOD FOR FORMING

[75] Inventor: David R. Boswell, Reading, England

[73] Assignee: NovaVision, Inc., Bowling Green, Ohio

[21] Appl. No.: 541,312

[22] Filed: Oct. 10, 1995

Related U.S. Application Data

[63] Continuation-in-part of Ser. No. 222,283, Apr. 4, 1994, Pat. No. 5,464,960.

[51] Int. Cl.$^6$ ............................................. B32B 9/00
[52] U.S. Cl. ...................... 428/467; 428/195; 428/212; 428/411.1; 428/457; 428/461; 428/484; 428/913
[58] Field of Search .................... 428/411.1, 412, 428/446, 484, 500, 913, 467, 195, 212, 457, 461

[56] References Cited

U.S. PATENT DOCUMENTS

| | | |
|---|---|---|
| 4,012,552 | 3/1977 | Watts . |
| 4,225,211 | 9/1980 | Abe . |
| 4,340,438 | 7/1982 | Davis . |
| 4,357,395 | 11/1982 | Lifshin et al. . |
| 4,378,141 | 3/1983 | Yevick . |
| 4,477,312 | 10/1984 | Czichy . |
| 4,495,232 | 1/1985 | Bauser et al. . |
| 4,545,838 | 10/1985 | Minkus et al. ............ 156/220 |
| 4,603,937 | 8/1986 | Copp . |
| 4,629,647 | 12/1986 | Sander ................. 428/172 |
| 4,631,222 | 12/1986 | Sander . |
| 4,657,803 | 4/1987 | Pernicano . |
| 4,701,235 | 10/1987 | Mitsam . |
| 4,717,615 | 1/1988 | Reinhart . |
| 4,725,111 | 2/1988 | Weitzen et al. . |
| 4,728,377 | 3/1988 | Gallagher . |
| 4,758,296 | 7/1988 | McGrew . |
| 4,759,969 | 7/1988 | Sander . |
| 4,773,718 | 9/1988 | Weitzen et al. . |
| 4,778,262 | 10/1988 | Haines . |
| 4,832,445 | 5/1989 | Haines et al. . |
| 4,837,072 | 6/1989 | Kraetschmer . |
| 4,856,857 | 8/1989 | Takeuchi et al. . |
| 4,877,710 | 10/1989 | Ishikawa . |
| 4,892,602 | 1/1990 | Oike et al. . |
| 4,893,887 | 1/1990 | Coates . |
| 4,900,111 | 2/1990 | D'Amato et al. . |
| 4,908,285 | 3/1990 | Kushibiki et al. . |
| 4,913,504 | 4/1990 | Gallagher . |
| 4,913,858 | 4/1990 | Miekka et al. . |
| 4,921,319 | 5/1990 | Mallik . |
| 4,933,120 | 6/1990 | D'Amato et al. . |
| 4,969,700 | 11/1990 | Haines . |
| 4,971,646 | 11/1990 | Schell et al. . |
| 4,976,799 | 12/1990 | Wood . |
| 4,978,593 | 12/1990 | Yin et al. . |
| 4,990,415 | 2/1991 | Yu . |
| 4,994,131 | 2/1991 | Edwards . |
| 5,003,915 | 4/1991 | D'Amato et al. . |
| 5,013,494 | 5/1991 | Kubo et al. . |
| 5,013,632 | 5/1991 | Weber . |
| 5,044,707 | 9/1991 | Mallik . |
| 5,053,260 | 10/1991 | Brehm . |
| 5,063,658 | 11/1991 | Wild . |
| 5,071,597 | 12/1991 | D'Amato et al. . |

(List continued on next page.)

*Primary Examiner*—William Krynski
*Attorney, Agent, or Firm*—Emch, Schaffer, Schaub & Porcello

[57] ABSTRACT

A foil/composite sheet having a holographic image or diffraction grating image and a method for forming permits the party producing the final document to hot stamp a chip containing the holographic image directly on a substrate forming the major portion of the final document. The foil/composite sheet includes successively a plastic carrier film, a release coating, a hard lacquer coating, a soft lacquer coating, a layer of metal and an embossment receiving coating, the latter three of which become embossed with the holographic image when a heated embossing shim is pressed under pressure against the embossment receiving layer. A heat activatable adhesive is thereafter applied to the embossment receiving coating.

14 Claims, 6 Drawing Sheets

U.S. PATENT DOCUMENTS

| | | |
|---|---|---|
| 5,083,850 | 1/1992 | Mallik et al. |
| 5,085,514 | 2/1992 | Mallik et al. |
| 5,087,510 | 2/1992 | Tokas et al. |
| 5,116,548 | 5/1992 | Mallik et al. |
| 5,128,779 | 7/1992 | Mallik |
| 5,142,383 | 8/1992 | Mallik |
| 5,145,212 | 9/1992 | Mallik |
| 5,155,604 | 10/1992 | Miekka et al. |
| 5,162,927 | 11/1992 | Moss et al. |
| 5,164,227 | 11/1992 | Miekka et al. |
| 5,172,250 | 12/1992 | Tsuchiya et al. |
| 5,186,787 | 2/1993 | Phillips et al. |
| 5,189,531 | 2/1993 | Palmer et al. |
| 5,191,449 | 3/1993 | Newswanger |
| 5,194,971 | 3/1993 | Haines |
| 5,199,744 | 4/1993 | Shenton |
| 5,300,169 | 4/1994 | Tahara |
| 5,464,690 | 11/1995 | Boswell |

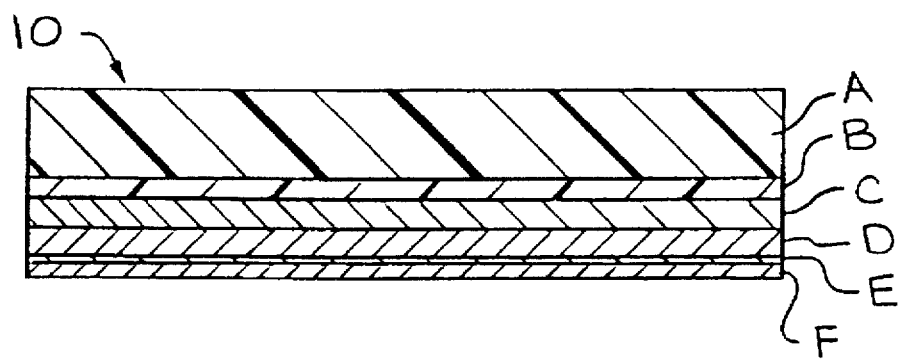
FIG. 1
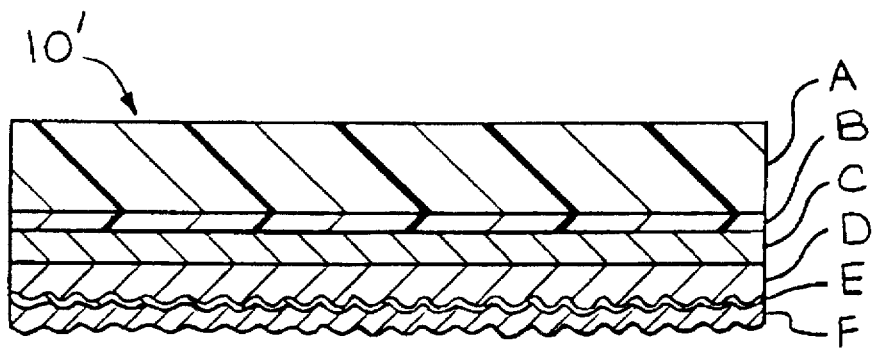
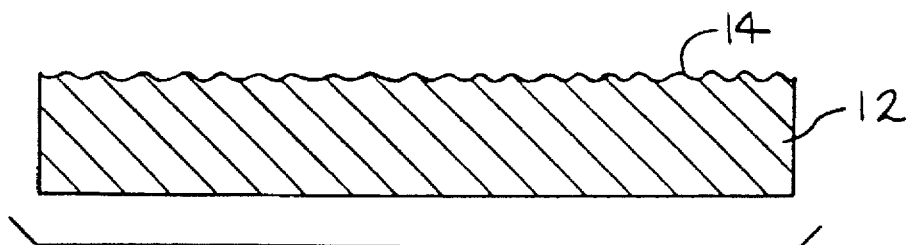
FIG. 2
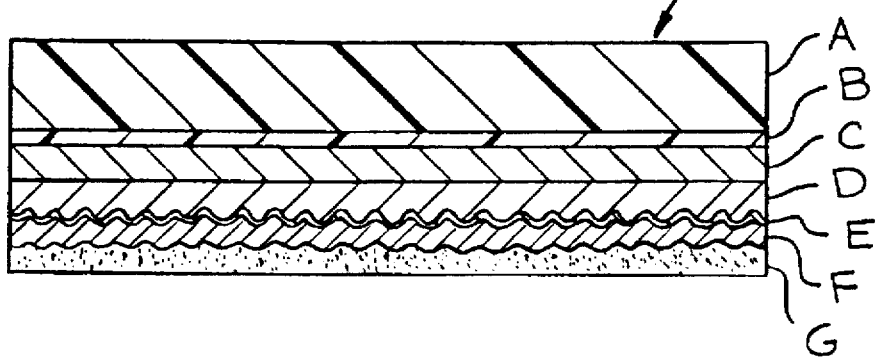
FIG. 3

HOLOGRAPHIC FILM AND METHOD FOR FORMING

CROSS-REFERENCE TO RELATED APPLICATION

This is a continuation-in-part to application Ser. No. 08/222,283, filed Apr. 4, 1994, now U.S. Pat. No. 5,464,960.

BACKGROUND ART

The use of holographic images, particularly on documents and credit cards for security purposes, has become extremely widespread. However, despite such widespread use, the use of holographic images is fairly expensive and generally involves the manufacture of a holographic image on a discrete chip in one operation and, in a separate operation, the adhering or laminating of such holographic chip to the intended document or article such as a stock certificate, check, or verification/identification card. U.S. Pat. No. 4,913,858, incorporated herein by reference, shows one prior art method of embossing holographic images or diffraction pattern images to a plastic film or to a plastic coating of a substrate, such as paper sheeting. It is believed that the present invention incorporates advantages not available in that or other prior art. Other patents which disclose various methods for forming holograms or diffraction grating images on substrates include U.S. Pat. Nos. 5,087,510; 4,773,718; 4,728,377 and 4,717,615.

My previous patent application Ser. No. 08/222,283, filed Apr. 4, 1994 provided new and unique articles of manufacture and a method for forming a holographic image or diffraction pattern directly on a composite sheet immediately following its being affixed to the substrate forming a major component of the finished article whether it be a security document, check, verification/identification card or other document upon which it is desired to provide a hologram or diffraction grating image. Such previous patent application also disclosed and claimed a new composite sheet and method for forming such composite sheet which may be used in directly forming a hologram or diffraction grating image on a chip of such composite sheet when such chip is affixed to the substrate of the intended finished document or article.

DISCLOSURE OF THE INVENTION

Under the present invention there is provided a new composite sheet or film having formed therein a diffraction grating image such as a hologram or the like and a method of forming such composite sheet. The composite sheet of the present invention has a hologram or diffraction grating image embossed therein and can be used to transfer a selected portion (i.e., a chip) of such composite sheet from a carrier film of polyester or other suitable plastic to a security document or other substrate by means of a conventional flat stamping die or smooth faced roller die of a desired size to thereby form the finished document or other article with a holographic image or diffraction grating image permanently affixed thereto.

Under the present invention a carrier film substrate having a thickness on the order of 12 microns to 50 microns and formed of a suitable plastic material such as a polyester, oriented polypropylene or other suitable material is coated with a release coating such as a microcrystalline wax or a partially saponified montan wax or other wax based coating described herein having a thickness in the range of 0.025 microns to 5 microns and then has a coating of hard lacquer applied over the release coating in a thickness in the range of 0.5 microns to 5 microns. The hard lacquer coating may be applied by a gravure roller following which it is dried and the partially completed composite film is re-reeled. A soft lacquer coating also having a thickness in the range of 0.5 microns to 5 microns is then applied by means of a gravure roller. This portion of the composite film is then re-reeled. Thereafter, a layer of metal such as aluminum is applied to the soft lacquer coating by vacuum deposition or other well known applying method in a thickness in the range of 20 millimicrons to 100 millimicrons. The metal layer is then coated with an embossment receiving coating having thickness in the range of 0.25 microns to 1 micron. The embossment receiving coating is formed of a wax-based coating described herein.

Thereafter, a holographic image or diffraction grating image is thermodynamically embossed against the embossment receiving coating of the thus formed composite sheet. Preferably, such embossing will be performed using a nickel shim bearing the image. The holographic image or diffraction grating image is thus embossed under heat and pressure such that the image extends into (1) the embossment receiving coating, (2) the aluminum or other metal coating and (3) the soft lacquer layer. Thus, each of these three coatings will be deformed to have substantially the same profile as the holographic or diffraction grating image in the nickel shim. As viewed from the embossment receiving coating side, the image will be the mirror image of that of the nickel shim.

The characteristics of the embossment receiving coating, the aluminum or other metal coating and the soft lacquer coating are such that the holographic or diffraction grating image may be embossed at a temperature in the range of 175° C. The hard lacquer coating serves to prevent release of the various layers from the polyester film or other plastic substrate during the embossing step. If the layer of hard lacquer coating were not there, it is likely that the heat and pressure to which the composite sheet is subjected during the embossing step would activate the release coating and cause the polyester or other plastic substrate to prematurely separate from the other layers.

Preferably, immediately following the step of embossing the holographic image, the composite sheet is passed over a chilled roller to fix the holographic image or diffraction grating image to prevent post embossing deformation of the grooves in the holographic image thereby insuring that such image will retain the sharp peaks as originally embossed by the nickel shim. The embossment receiving coating is then coated with a heat activated adhesive which serves the dual function of protecting the holographic image or diffraction grating image and providing the enabling medium to effect adherence of a chip of such composite sheet with the holographic image or diffraction grating image to a document or other substrate.

The composite sheet thus formed is now in a condition for shipping to a customer desiring to affix a security seal bearing a holographic image or diffraction grating image to the final document. As will be appreciated, since the composite sheet being shipped to the customer has the holographic or diffraction grating image incorporated therein, the customer will be able to affix a chip with such holographic image or diffraction grating image security seal to a document or other substrate with a conventional smooth-faced hot stamping die or roller without the necessity of such customer maintaining shims with the holographic image. This permits a rapid and efficient transfer from the carrier film to the document or other substrate resulting in high productivity and excellent efficiencies.

The presence of the embossment receiving coating over the aluminum or other metal coating permits the holographic or diffraction grating image to be embossed while eliminating the possibility of contamination of the nickel or other type of shim bearing the holographic image by the aluminum or other metal of the composite sheet, which may happen when holographic images are embossed directly into the metal layer.

Other prior art patents which disclose various constructions of film or foil including ones having holograms or other three-dimensional patterns formed therein are noted as follows: U.S. Pat. Nos. 4,758,296; 4,837,072; 4,892,602; 4,856,857; 5,087,510 and 5,300,169. It is believed that the present invention clearly distinguishes over the referenced prior art patents.

Accordingly, it is an object of the present invention to provide a new and efficient method for forming a composite sheet bearing a holographic image which may be transferred to a final substrate.

It is a further object of the present invention to provide a composite sheet suitable for receiving a holographic image which can be transferred to a document or other substrate using conventional hot stamping equipment having a smooth stamping die.

It is another object of the present invention to provide a composite sheet having a holographic image or diffraction grating image formed therein.

These and other objects of the present invention will become readily apparent to those skilled in the art from the following description and drawings.

BRIEF DESCRIPTION OF THE DRAWINGS

FIG. 1 is a sectional view of the composite sheet of the present invention showing the various layers of the structure suitable for having embossed thereon a holographic image or diffraction grating image.

FIG. 2 is a view similar to FIG. 1 showing such composite sheet with a holographic image or diffraction grating image embossed into the embossment receiving layer, the layer of aluminum or other metal and the layer of soft lacquer and showing an embossed metal shim spaced therefrom following the step of embossing the composite sheet.

FIG. 3 is a sectional view of the embossed composite sheet of FIG. 2 with a heat activated adhesive coating applied to the embossment receiving layer.

BEST MODE OF CARRYING OUT THE INVENTION

Figure 4:
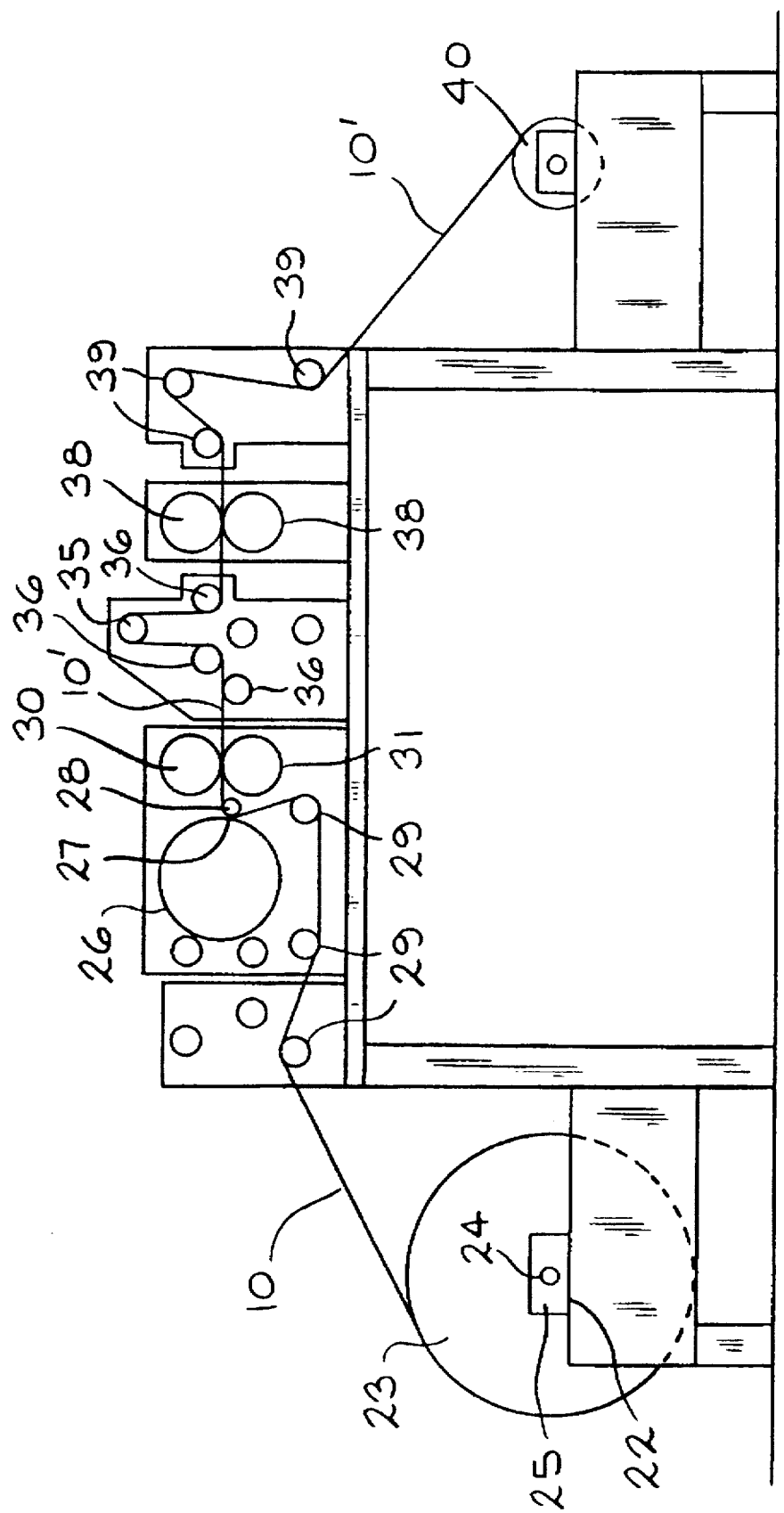
FIG. 4 is a schematic view showing one type of apparatus for applying the holographic or diffraction grating image to the composite sheet.

Referring now to FIG. 1, there is shown a composite sheet 10 constructed according to the present invention to which may be applied a holographic image or other diffraction grating image. The composite sheet 10 comprises six layers including a support film substrate A. The film substrate A has a thickness in the range of 12 microns to 50 microns and may be formed of one of a number of different types of material including a film of polyester such as polyethyleneterephthalate or a film of biaxially oriented polypropylene, cellulose tri-acetate, polystyrene, polyethylene or polyvinylchloride. In one example, the substrate was a polyester film having a thickness of 12 microns obtained from ICI Films, Wilmington, Del. (Product I.D. Melinex HS-2). A release coating B of a wax such as a microcrystalline wax or a montan wax or a siloxane having a thickness in the range of 0.025 microns to 5 microns is applied to the film substrate A.

A coating C of a hard lacquer such as polymethyl methacrylate, styrene acrylonitrile, polyethyleneterephthalate or nitrocellulose is applied to the release coat in a thickness in the range of 0.5 microns to 5 microns.

A soft lacquer coating D is then applied to the hard lacquer coating C. The soft lacquer coating D is a thermosoftening lacquer containing acrylic and/or nitrocellulose and/or chlorinated rubber. The soft lacquer coating D has a thickness in the range of 0.5 microns to 5 microns. A soft lacquer coating is one which has a lower softening/glass transition temperature relative to a hard lacquer coating which has a higher softening/glass transition temperature. The specifics of the soft lacquer and the differences between it and the hard lacquer will be described in example hereinafter set forth.

A very thin layer of metal E having a thickness in the range of 20 millimicrons to 100 millimicrons is applied to the soft lacquer coating D by vacuum metal deposition or sputtering or electron beam deposition. The metal layer E is preferably aluminum; however, it could be stainless steel, nichrome, gold, silver, platinum or any other metal which can be vaporized and deposited by vacuum deposition or applied by sputtering or electron beam deposition.

The final coating for the composite sheet is an embossment receiving coating F which has a thickness in the range of 0.025 micron to 1 micron and is formed of a montan wax base. The embossment receiving coating F in one example was formed of an esterfied montan wax obtained from Hoechst A.G., Augsburg, Germany (Product identification Hoechst OP) dissolved in toluene which was combined with aluminum stearate obtained from Whitaker, Clark and Daniels, South Plainfield, N.J. (Product I.D. #909). Twenty-five grams of aluminum stearate was dissolved in 1.14 liters of toluene by heating and/or stirring. When dissolved, the solution is further heated to 65° C. until a firm gel forms. Separately, 30 grams of the esterfied montan wax was dissolved in 1.14 liters of toluene by heating and/or stirring until a clear solution was formed. The clear solution was then added to the gel and stirred to form a mixture which was thereafter added to 36.3 liters of toluene. Finally, 9 grams of ethyl cellulose was added to such mixture and stirred for 20 minutes. The embossment receiving coating F was applied to the metal layer E of the partially formed composite sheet consisting of a polyester substrate A, release coating B, hard lacquer layer C, soft lacquer layer D and metal layer E.

The coating material thus formed for the embossment receiving coating F was also used for the release coating B. However, the release coating could also be a siloxane or a microcrystalline wax.

The coating C of hard lacquer was formed of 2.4 kilograms of imide modified acrylic obtained from Rohm and Haas under its product identification QR-1381 and 4.8 kilograms cellulose nitrate obtained from Hercules, Inc. under its product identification RS 18-25. These were mixed with 27.3 liters of methyl ethyl ketone and 2.3 liters of xylene. These were dissolved by fast stirring and then were thinned by providing one part of the above formulation in 72 parts of methyl ethyl ketone.

The soft lacquer coating D was formed by mixing 10 kilograms of polymethyl methacrylate obtained from Rohm and Haas (Product I.D. Acryloid B-99) and 20 kilograms of cellulose nitrate obtained from Hercules, Inc., Wilmington, Del. (Product I.D. RS 18-25) and dissolving the mixture by high speed stirring in 90.8 liters of methyl ethyl ketone and 9.03 liters of xylene. The soft lacquer coating D has a glass transition temperature (Tg) of 62° to 68° C. The hard lacquer coating C has a glass transition temperature (Tg) of approximately 82° C.

As shown schematically in FIG. 2, the composite sheet 10 as thus constructed has a holographic or diffraction grating image embossed into the embossment receiving coating F, the metal layer E and the soft lacquer D. The embossing of such holographic image or diffraction grating image into the three layers consisting of the embossment receiving coating F, the metal layer E and the soft lacquer coating D is accomplished by applying a nickel shim 12 or other suitable shim having a holographic or diffraction grating image 14 formed thereon. Such embossing is carried out under heat and pressure with the shim being applied to the embossment receiving coating F side of the composite sheet 10. Desirably, the shim 12 will be maintained at a temperature in the range of 100° C. to 250° C. and preferably about 175° C. and applied to the composite sheet 10 under a pressure of 200 to 400 pounds per linear inch with the result that the holographic or diffraction grating image will extend into the embossment receiving layer F, the layer of metal E and the soft lacquer coating D thereby forming an embossed composite sheet 10'. The shim 12 may be maintained at a temperature in the range of 100° C. to 250° C. The application pressure may be in the range of 200 to 400 pounds per linear inch. With the embossing step being performed under the above temperature and pressure parameters, the layer of hard lacquer C will serve to insulate and thereby prevent activation of the release coating B with the result that the substrate A will remain adhered to the remaining layers of the embossed composite sheet 10' and not be prematurely separated therefrom.

Thereafter, as may be seen in FIG. 3, a coating of heat activated adhesive G is applied over the embossment receiving coating F and the embossed holographic or diffraction grating image. The heat activated adhesive coating G serves a dual function of protecting the embossed holographic or diffraction grating image and functioning, at a later time, to adhere a chip from the embossed composite sheet 10' bearing the holographic or diffraction grating image to a desired substrate. The application of the heat activated adhesive coating G completes the construction of a final holographic composite sheet 20.

The heat activated adhesive coating G is formulated for its ability to adhere to the particular substrate to be used in the final document. Such final document could be a stock certificate, check or verification/identification card. Such substrate, for example, might be plain or printed paper, coated paper, a sophisticated security paper, or a plastic such as polyethyleneterephthalate, polyvinylchloride, oriented polypropylene, acetate or the like. Heat activated adhesives are well known and can be readily obtained for use in adhering to any of the above types of substrates. The thickness of the heat activated adhesive coating may be in the range of 0.75 microns to 4 microns.

In one example a heat activated adhesive coating was formed by first formulating an adhesive base consisting of 3.6 kilograms of polyvinyl butyrate obtained from Monsanto Chemical Co., St. Louis, Mo., (Product I.D. Butuar B-90) with 4.5 kilograms polyvinyl acetate multipolymer obtained from Monsanto (Product I.D. Gelva 269) and 12.5 kilograms of acrylic emulsion obtained from Harlow Chemicals under its product Emultex AC430. Such formulation was mixed with 27.3 liters of tap water and 90.8 liters of industrial ethanol. 450 grams of a brown die was added for identification purposes.

The mill charge was formed by mixing 7 kilograms of polyvinyl chloride (PVC) resin obtained from Union Carbide Corp., New York, N.Y. (Product I.D. VMCH) and 1.1 kilograms of cellulose nitrate obtained from Hercules, Inc. (Product I.D. RS 18-25) with 23.9 liters of industrial ethanol. These were mixed under a stirrer for 10 minutes and then ball milled for 6 to 8 hours after which 9 liters of industrial ethanol was added and the mixture further ball milled for an additional 10 minutes to form a mill charge mixture. 36.6 liters of the adhesive base had added thereto 2 kilograms of titanium dioxide obtained from E.I. du Pont DeNemours & Co., Wilmington, Del. (Product No. Ti-pure R-900) and was then mixed with the mill charge mixture to form the adhesive used in adhesive layer G.

A significant advantage of the composite sheet 10 and the method of forming an embossment in sheet lies in the fact that the embossing shim 12 which is formed of nickel or other suitable material does not come in direct contact with the layer of aluminum E or other metal. As a result, the shim 12 is protected against contamination which may occur in those embossing operations in which the shim 12 is in direct contact with the metal layer. Thus, the embossment coating F serves to protect the shim 12 from making direct contact with the layer of metal E but is sufficiently soft to permit the embossment image 14 to extend therethrough, through the layer of metal E and into the soft lacquer coating D. As a result, the life of shims used in forming the holographic or diffraction grating image embossments is greatly extended over the life of similar shims which form embossments by direct contact with a metal layer such as the metal layer E.

Referring now to FIG. 4, there is shown schematically one form of apparatus which may be utilized to emboss a holographic image or diffraction grating image into the composite sheet 10 to thereby form the image containing composite sheet 10' shown in FIG. 2. The apparatus includes a mounting 22 for receiving a reel 23 of the composite sheet 10 for rotation about an axle 24. A driver clutch 25 may be provided to rotate and unwind the reel 23 as necessary or desirable.

A smooth, chrome-faced roller 26 is maintained at a temperature of approximately 200° C. to preheat the composite sheet 10 along a line of contact 27 resulting from pressing the composite sheet 10 against the chrome-faced roller 26 by a pressure roller 28 urged thereagainst. The chrome-faced roller 26 is driven by means well known in the art and desirably has a diameter on the order of 12 inches. The pressure roller 28 may be much smaller, having a diameter on the order of one to two inches.

As can be seen in FIG. 4, the composite sheet 10 is fed over and under a plurality of idler rollers 29 as it traverses the path from the reel 23 to the chrome-faced roller 26.

Immediately after exiting the nip between the chrome-faced roller 26 and the pressure roller 28, the composite sheet 10 is fed between the embossing roller 30 and a rubber nip roller 31 which is urged firmly thereagainst. Both the embossing roller 30 and the rubber nip roller 31 are driven. The embossing roller 30 has a circumferential shim in which is formed the desired holographic image, diffraction grating image or other three-dimensional pattern. The embossing roller preferably has a diameter of approximately 6 inches and is maintained at a temperature such that the circumferential shim is in the range of 100° C. to 250° C. and preferably approximately 175° C. Under such conditions with the rubber nip roller 31 urged thereagainst under a pressure of 200 to 400 pounds per linear inch, the holographic image will be embossed into the embossment receiving layer F, the metal layer E and the soft lacquer coating D. The rubber nip roller 31 preferably has a 6 inch diameter and is maintained at ambient temperature.

Thus, exiting from the nip between the embossing roller 30 and the rubber roller 31 will be the embossed composite sheet 10' shown in FIG. 2.

The newly embossed composite sheet 10' is immediately looped around a chill roller 35 having a smooth steel or other suitable metal face maintained at a temperature in the range of 30°–55° C. Preferably, the chill roller is approximately 4 inches in diameter. The embossed composite sheet 10' is fed around a second set of idler rollers 36 in order to form a loop so that the newly embossed composite sheet 10' will be maintained in engagement with the chilled face of the chill roller 35 throughout approximately 180° of such chill roller's face. Thereafter, the embossed composite sheet 10' is fed between a pair of rubber nip rollers 38. The rubber nip rollers 38 are approximately 4 inches in diameter, are maintained with a surface temperature on the order of 25° C. and are both driven.

After exiting the nip rollers 38, the embossed composite sheet 10' is fed over a third set of idler rollers 39 and wound onto a storage reel 40.

If desired, an additional station can be provided prior to the embossed composite sheet reaching the storage reel at which the layer of hot melt adhesive G is applied to the embossment receiving coating F side of the embossed composite sheet. In that case it will be the completed holographic composite sheet 20 which is wound on the storage reel. Alternatively, the heat activated adhesive coating G can be applied in a separate coating operation in which the embossed composite sheet 10' is unreeled from the storage reel 40, passed through a coating station at which the heat activated adhesive coating layer G is applied and then re-reeled to a separate storage reel.

The composite sheet 10 of the present invention has the capability of having the holographic image or diffraction grating image formed therein at an exceptionally high rate of speed. For example, rolls of composite sheet 10 having a width of 40 inches had holograph images embossed therein to form embossed composite sheets 10' or final holographic composite sheets 20 at a rate of 2000 meters per hour.

Figure 5:
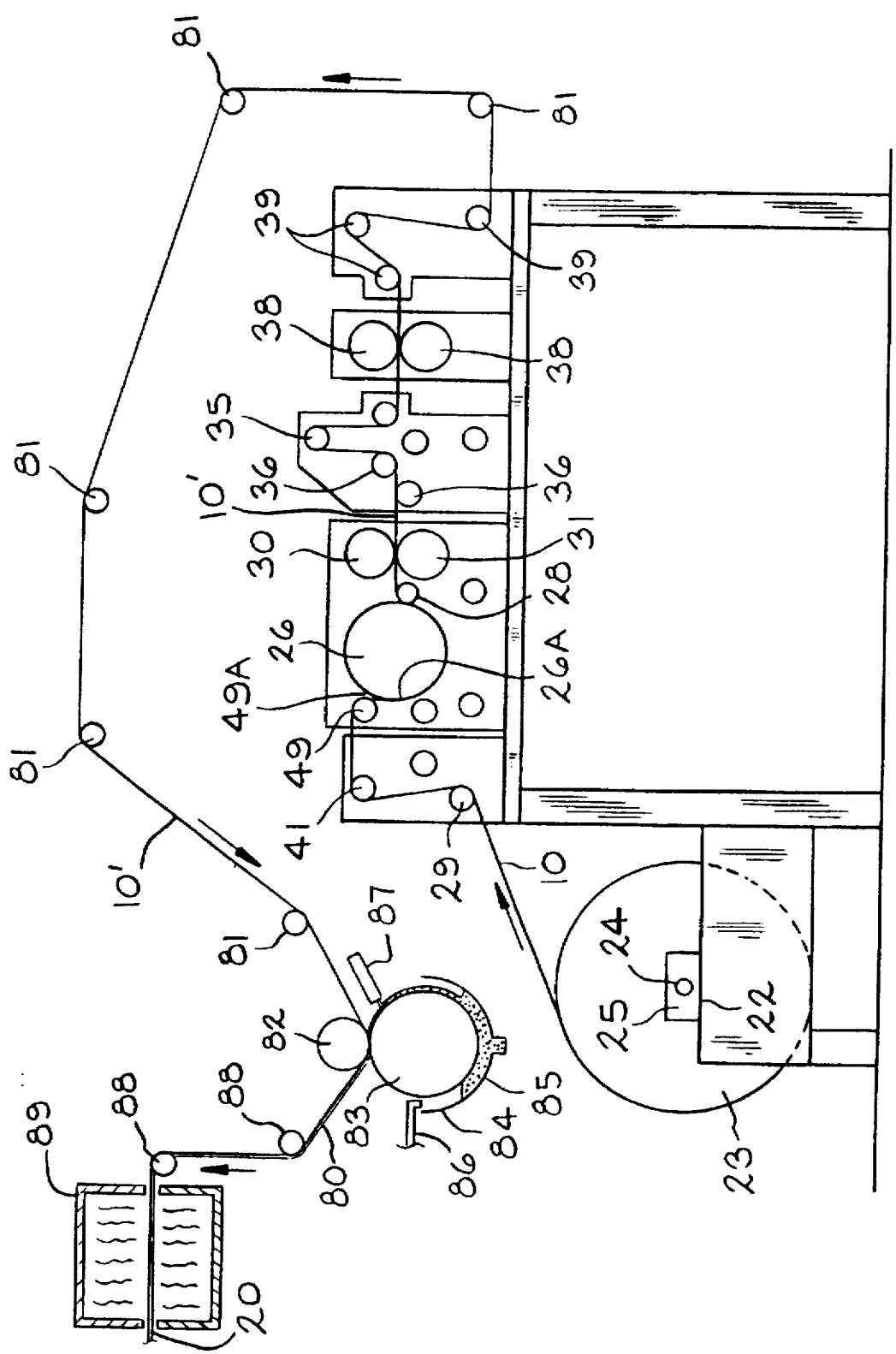
FIG. 5 is a view similar to FIG. 4 showing the path followed when the composite sheet has a substrate layer of oriented polypropylene and showing further apparatus for applying heat activated adhesive coating to the embossment receiving layer.

Apparatus and the feeding path for the composite sheet 10 shown in FIG. 4 are suitable for a composite sheet having a substrate A formed of a polyester or most other types of plastic; however, for a composite sheet 10 which has a substrate A of oriented polypropylene, it is desirable that the composite sheet follow a flow path as shown in FIG. 5. Thus, as shown in FIG. 5, the composite sheet 10 is fed from the supply reel 23, around a lower idler roller 29, then upwardly over a pair of upper idler rollers 41 and 49. Roller 49 has its exit side 49A substantially vertically aligned with the entrance side 26A of the chrome-faced roller 26. The pressure roller 28 is positioned on the opposite side of the chrome-faced roller 26 from the entrance side 26A with the result that the polypropylene composite sheet 10 is in contact with such chrome-faced roller 26 throughout approximately 180° of its circumferential face. Contact of the composite sheet 10 over such widespread surface area serves to stabilize the oriented polypropylene substrate A. Except for the stabilizing influence caused by such widespread contact between the heated (200° C.) chrome-faced roller 26, the oriented polypropylene substrate A of composite sheet 10 would have a tendency to shrink. If it were subjected to such heat along the line contact 27 illustrated in FIG. 4, such shrinkage would prevent the formation of commercially satisfactory product.

FIG. 5 also shows apparatus for applying heat activated adhesive to the embossment layer of the newly embossed composite sheet 10'. As will be appreciated, when the embossed composite sheet 10' exits the nip between the embossing roller 30 and the rubber nip roller 31, the newly embossed embossment receiving coating F will be facing upwardly. After exiting the last of the third set of idler rollers 39, rather than being wound onto a storage reel, the embossed composite sheet 10' is looped over and under a fourth set of idler rollers 81 and directed between a pressure roller 82 and a gravure cylinder 83. The gravure cylinder 83 is mounted for rotation such that its lower one-third to one-half is positioned in a pan 84 in which liquified heat actuated adhesive 85 is contained. As the gravure cylinder 83 rotates in the pan 84, its lower-most surface will be dipped into the liquified adhesive 85 and carry such adhesive as it exits from the pan 84. An applicator pipe 86 continuously replenishes liquified adhesive in the pan 84. Desirably, a doctor blade 87 is positioned between the exit side of the pan 84 and the roller 82 to remove excess liquid adhesive 85. As a result, the proper amount of adhesive will be applied to the embossed composite sheet 10' to provide a coated web 80. The coated web 80 is passed over a pair of idler rollers 88 and through a drying tunnel 89 which sets the liquified adhesive 85 thus forming the final holographic composite sheet 20.

Figure 10:
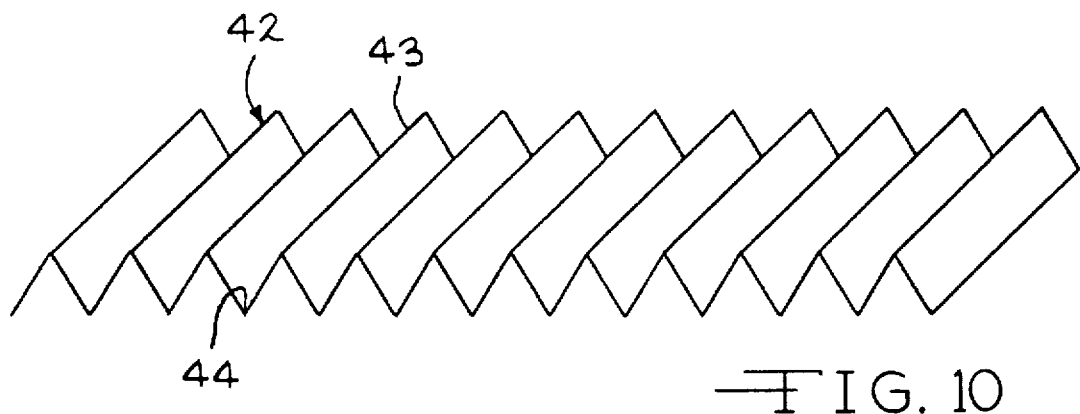
FIG. 10 is a schematic representation of a holographic or diffraction grating image showing the sharp peaks of a commercially satisfactory holographic or diffraction grating image.
Figure 11:
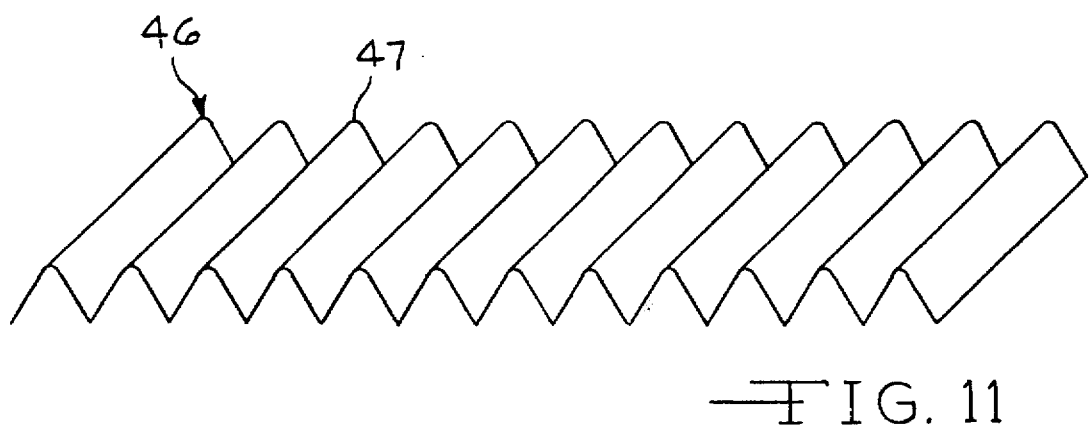
FIG. 11 is a view similar to FIG. 10 showing peaks which have been subjected to post embossing deformation which undesirably places the image "out of focus".

Referring now to FIGS. 10 and 11, there is schematically illustrated in FIG. 10 a holographic image 42 having sharp peaks and fine detail which will result in a sharp image for the stamping foil. Thus, the holographic image 42 of FIG. 10 has sharp peaks 43 and sharp valleys 44. The ability to obtain sharply defined peaks 43 and valleys 44 in the holographic image or diffraction grating image of the embossed composite sheet 10' results from the passing of the newly embossed composite sheet 10' over the chilled roller 35 to firmly set the layer of soft lacquer D along with the metal layer E and the embossment receiving coating F.

In contrast, FIG. 11 illustrates schematically a holographic image 46 embossed in an identical composite sheet but which did not pass around a chill roller such as the chill roller 35. Since the embossment receiving coating F and the soft lacquer coating D are relatively soft and the metal layer has no strength of its own, the embossed image will be subject to post embossing deformation in which the originally embossed sharp peaks collapse slightly to form rounded peaks 47 if the newly embossed composite sheet 10' is not subjected to the chilling step provided by the chilled roller 35.

Figure 6:
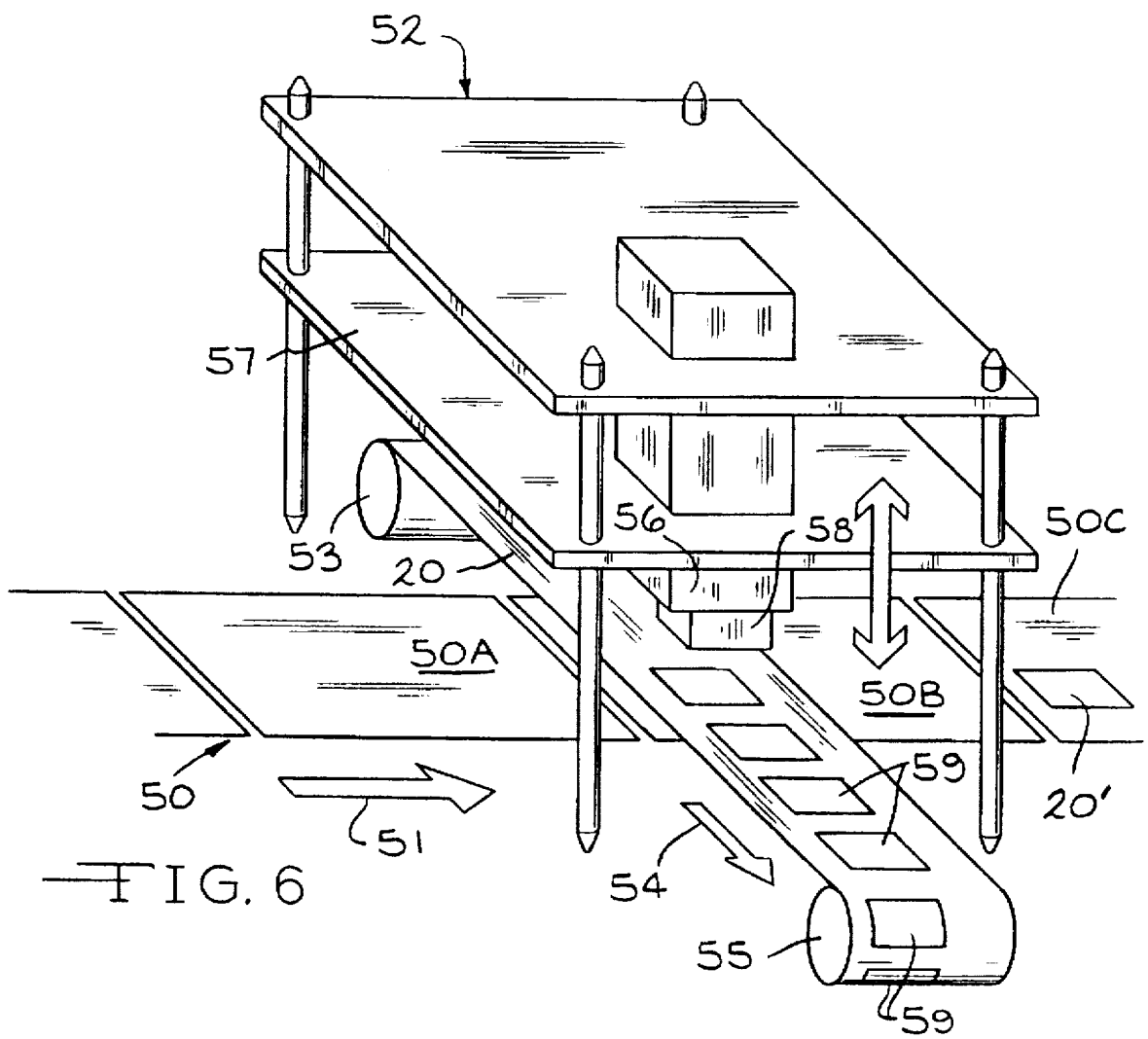
FIG. 6 is a schematic view showing one type of apparatus for hot stamping with a smooth, flat heated die, a chip from the composite sheet bearing the holographic image or diffraction grating image onto a substrate.
Figure 8:
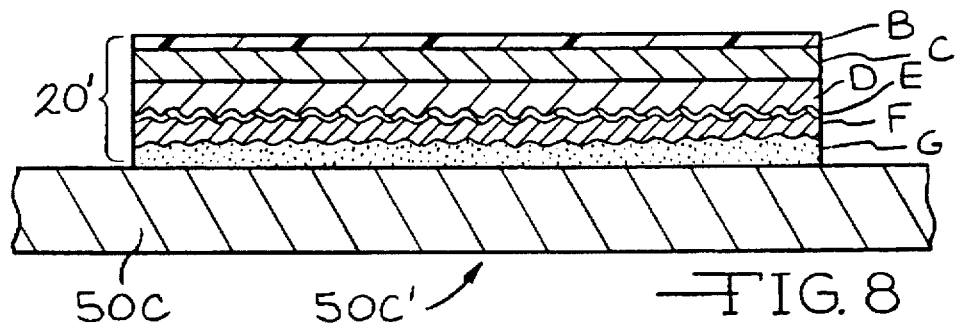
FIG. 8 is a sectional view showing the structure of a final document with a chip bearing the holographic image adhered thereto.
Figure 9:
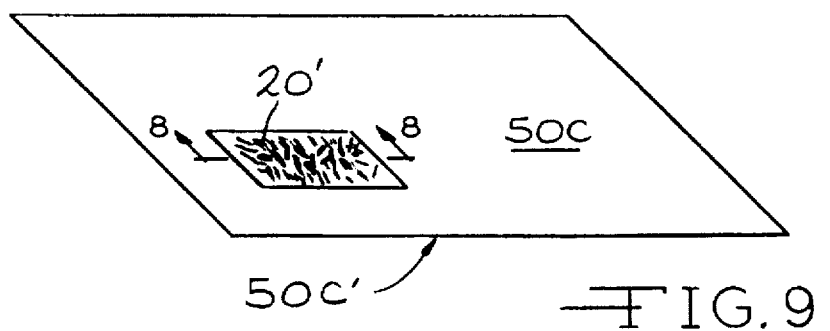
FIG. 9 is a perspective view of one form of final document with a chip bearing the holographic image adhered thereto.

Referring now to FIG. 6, there is shown schematically one apparatus and process for successively hot stamping small areas of the embossed holographic composite sheet 20 to a document substrate 50 thereby leaving a small portion of the holographic composite sheet 20 which may be characterized as a chip 20' having an area the size of the stamping die adhered to the document substrate 50 to thereby form the final document. One such final document 50C' is shown in FIGS. 8 and 9.

As shown in FIG. 6, the document 50 is a continuous strip containing a series of discrete, interconnected sections 50A, 50B and 50C, etc., and is fed along a horizontal path from a supply roll (not shown) to a take-off station (not shown). The sections 50A, 50B and 50C, etc., may have printing and constitute the major portions of finished documents to which a chip 20' having holographic image or diffraction grating image embossed thereon is to be transferred and adhered.

The document substrate 50 may be formed of various types and qualities of paper, including papers coated with a wide variety of plastics or other materials, security paper or a film of plastic such as polyethyleneterephthalate, polyvinylchloride, oriented polypropylene, polyethylene, acetate or the like. Assuming the document substrate 50 is for use in the manufacture of security documents such as stock certificates, the interconnected sections 50A, 50B and 50C, etc., will preferably be fed with the primary printing information facing upward if it is desired to have the security hologram affixed to the primary viewing surface; however, it could obviously be reversed if it was desired to have the security hologram affixed to the reversed side.

The continuous strip of document substrate 50 is fed in the generally horizontal path in a first direction denoted by the arrows 51 beneath a stamping station 52.

The holographic composite sheet 20 is fed from a supply roll 53 beneath the stamping station 52, over the document substrate 50 in closely adjacent relationship thereto. The holographic composite sheet 20 is fed in a second direction indicated by the arrow 54 at substantially a 90° angle to the first direction 51. The holographic composite sheet 20 is positioned with the heat activated adhesive coating G contacting the document substrate 50 and the polyester or other plastic substrate A facing up or away from the document substrate 50. The plastic substrate A and the portions of the layers B, C, D, E, F and G of the holographic composite sheet 20 not transferred to the document substrate 50 are taken up by a take-up roll 55.

The stamping station 52 is provided with a hot stamping head 56 carrying a die 58 having a size and shape corresponding to the desired size and shape of the chip 20'. A flat support plate (not shown) is positioned immediately below the document substrate in a position aligned with the hot stamping head 56 and die 58. The hot stamping head 56 and die 58 are maintained at a temperature in the range of 75° C. to 250° C. and are mounted on a platform 57 for movement between a raised position shown in FIG. 6 and a lowered position. When the platform 57 is in a lowered position, the die 58 engages the holographic composite sheet on the plastic substrate A side, heating it and the rest of the holographic composite sheet 20 to a temperature in the range of 75° C. to 250° C. and urging the holographic composite sheet 20 against the underlying section of document substrate 50 and against the support plate. In FIG. 6, the underlying section is 50B of the document substrate. Immediately prior to engagement of the die 58 against the plastic substrate A, the holographic composite sheet 20 and the continuous strip of document substrate 50 are caused to briefly stop, with movement resuming when the head 56 and die 58 are raised.

As a result of the heat and pressure to which the holographic composite sheet 20 and the successive sections of document substrate 50 are subjected by clamping between the die 58 and the support plate, a portion of the heat activated adhesive layer G the size of the die is caused to become adhered to the specific section of the document substrate 50 so engaged, section 50B as shown in FIG. 6. At the same time, the heat causes a similarly sized portion of the release coating B of the holographic composite sheet 20 to separate from the plastic substrate A with the result that the section 50B of the document substrate 50 has affixed thereto a chip 20' portion of the holographic composite sheet 20 constituting the release coating B, the hard lacquer layer C, the soft lacquer coating D, the metal layer E, the embossment receiving layer F and the heat activated adhesive G (see FIG. 8) in a size corresponding to the size of the die 58. The die 58 is flat in order to provide substantially uniform heat and pressure to the underlying portion of the holographic composite sheet 20 and section 50B of the document substrate 50 during the stamping operation and thus ensure uniform adhesion of the adhesive layer G to the section 50B and successive sections and uniform release of the release coating B from the plastic substrate A. The hot stamping head 26 and die 28 should be maintained at a temperature in the range of 75° C. to 250° C. in order to bring the contacted portion of the holographic composite sheet 20 to such temperature range. As may be seen in FIG. 6, those portions of the plastic substrate A and holographic composite sheet 20 which were subjected to heat and pressure by the die 58 appear as a series of windows 59 containing only the plastic substrate A while the remaining portions being taken up by the take-up roll 55 consist of the plastic substrate A and all other layers of the holographic composite sheet 20, namely, B, C, D, E, F and G.

At an appropriate point after leaving the stamping station 52, the various sections of the document substrate, for example, section 50C with the chip 20' bearing the holographic image affixed thereto is cut or otherwise separated from the continuous strip of document substrate 50 thereby forming the final document 50C' shown in FIGS. 8 and 9. Thus, the finished document 50C' includes section 50C of the document substrate 50 and the affixed chip 20' bearing the holographic image or diffraction grating image and consisting of the release layer B, the hard lacquer coating C, the soft lacquer coating D, the metal layer E, the embossment receiving layer F and the heat activated adhesive layer G affixed to the document substrate section 50C.

Figure 7:
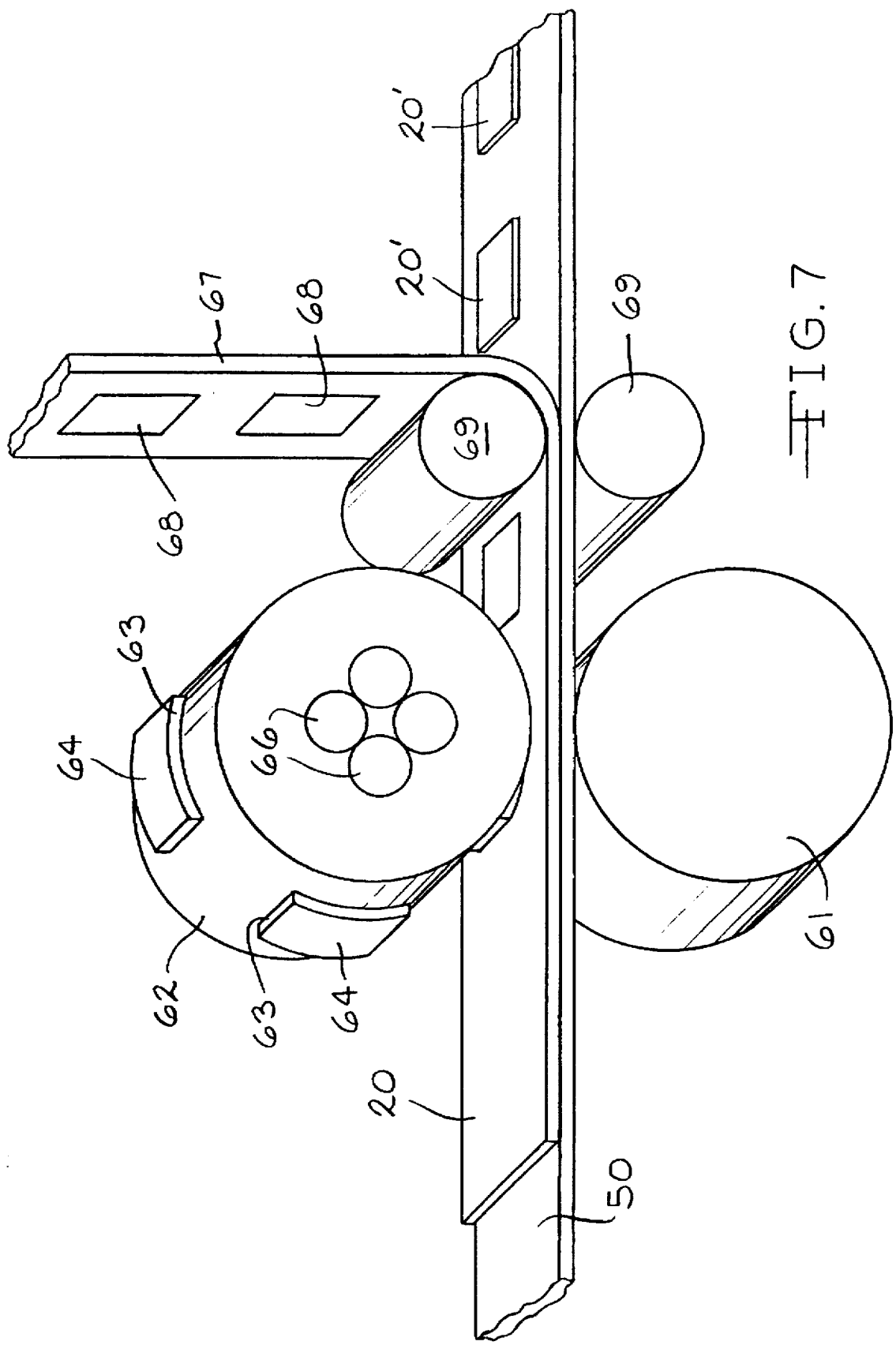
FIG. 7 is a schematic view showing another type of apparatus for applying a chip from the composite sheet bearing the holographic or diffraction grating image onto a substrate.

Referring now to FIG. 7, there is shown a modified apparatus for applying a chip 20' of the holographic composite sheet 20 to the document substrate to form the final document on a continuous basis. As shown in FIG. 7, the document substrate 50 and the holographic composite sheet 20 are fed in surface to surface engagement between a nip roller 61 and a heated metal roller 62 having aluminum or other type of smooth-faced metal dies 63 of a size and shape desired for the chip 20'. The metal dies 63 are intermittently spaced around the circumference of the metal roller and may, if desired, have a silicon rubber 64 thereon. The adhesive layer G of the holographic composite sheet 20 is facing and in contact with the document substrate 50. The nip roller 61 may be metal or a metal with a silicon rubber coating and is maintained at ambient temperature. The metal roller 62 is heated as by internal cartridge heaters 66. The internal cartridge heaters 66 may reach a temperature up to 400° C. and heat the aluminum dies 63 such that the temperature of the surface of the silicon rubber 64 is maintained at a temperature between 75° C. and 250° C.

As the holographic composite sheet 20 and the document substrate 50 are fed together between the nip roller 61 and the heated metal roller 62, those portions of the holographic composite sheet 20 which are subjected to heat and pressure between the aluminum dies 63 with their silicon rubber 64 and the nip roller 61 are caused to be released from the film substrate A such that a chip 20' consisting of the release coating B and the remaining layers C, D, E, F and G is adhered to the document substrate 50. A chip 20' is stamped to the document substrate 50 by each of the aluminum dies 63 with their silicon rubber thus forming a series of intermittent stamped chips 20'. All of the substrate A and those portions of the other layers B, C, D, E, F and G of the holographic composite sheet 20 not contacted by the aluminum dies 63 and/or silicon are removed as a continuous strip of waste material 67 by being separated from the document substrate 50 after passing through a pair of take-out rolls 69. Those portions of the holographic composite sheet 20 which were contacted by the aluminum dies 63 and/or silicon rubber appear on the strip of waste material 67 as a series of windows 68 containing only the plastic substrate A and, possibly, residue of the release coating B.

The document substrate 50 with intermittent chips 20' adhered thereto may then be cut to size thereby forming the final document such as that shown in FIGS. 8 and 9.

Many modifications will become readily apparent to those skilled in the art. Accordingly, the scope of the present invention should be determined only by the scope of the appended claims.

I claim:

1. A composite sheet comprising:
   (a) a thermoplastic substrate; ,
   (b) a release coating having a thickness of 0.025 microns to 5 microns affixed to said substrate;
   (c) a coating of hard lacquer having a thickness in the range of 0.5 microns to 5 microns affixed to said release coating, said hard lacquer having a glass transition temperature of at least 80° C.;
   (d) a coating of soft lacquer having a thickness in the range of 0.5 microns to 5 microns affixed to said hard lacquer coating, said soft lacquer having a glass transition temperature no higher than 70° C.;
   (e) a layer of metal having a thickness in the range of 20 millimicrons to 100 millimicrons affixed to said soft lacquer coating; and
   (f) an embossment receiving coating having a thickness in the range of 0.025 micron to 1 micron affixed to said layer of metal, said embossment receiving coating being an esterified montan wax.

2. The composite sheet of claim 1, wherein a diffraction grating image is embossed in said embossment receiving coating, said layer of metal and said soft lacquer coating.

3. The composite sheet of claim 1, wherein said embossment receiving coating includes esterfied montan wax combined with aluminum stearate, toluene and cellulose.

4. The composite sheet of claim 3, wherein a diffraction grating image is embossed in said embossment receiving coating, said layer of metal and said soft lacquer coating.

5. The composite sheet of claim 3, further including a coating of heat activatible adhesive having a thickness in the range of 0.75 microns to 4 microns affixed to said embossment receiving coating.

6. The composite sheet of claim 1, wherein said coating of soft lacquer is a member selected from the group consisting of acrylic, nitrocellulose and chlorinated rubber.

7. The composite sheet of claim 6, wherein said coating of hard lacquer is a member selected from the group consisting of polymethyl methacrylate, styrene acrylonitrile, polyethyleneterephthlate and nitrocellulose.

8. A composite sheet comprising:
   (a) a thermoplastic substrate having a thickness in the range of 12 microns to 50 microns;
   (b) a release coating having a thickness of 0.025 microns to 5 microns affixed said substrate;
   (c) a coating of hard lacquer having a thickness in the range of 0.5 microns to 5 microns affixed said release coating, said hard lacquer having a glass transition temperature of at least 80° C.;
   (d) a coating of soft lacquer having a thickness in the range of 0.5 microns to 5 microns affixed said hard lacquer coating, said soft lacquer having a glass transition temperature no higher than 70° C.;
   (e) a layer of metal having a thickness in the range of 20 millimicrons to 100 millimicrons affixed said soft lacquer coating; and
   (f) an embossment receiving coating having a thickness in the range of 0.025 micron to 1 micron affixed said layer of metal, said embossment receiving coating being an esterified montan wax.

9. The composite sheet of claim 8, wherein a diffraction grating image is embossed in said embossment receiving coating, said layer of metal and said soft lacquer coating.

10. The composite sheet of claim 8, wherein said embossment receiving coating includes esterified montan wax combined with aluminum stearate, toluene and cellulose.

11. The composite sheet of claim 10, wherein a diffraction grating image is embossed in said embossment receiving coating, said layer of metal and said soft lacquer coating.

12. The composite sheet of claim 9, further including a coating of heat activatible adhesive having a thickness in the range of 0.75 microns to 4 microns affixed said embossment receiving coating.

13. The composite sheet of claim 8, wherein said coating of soft lacquer is a member selected from the group consisting of acrylic, nitrocellulose and chlorinated rubber.

14. The composite sheet of claim 13, wherein said coating of hard lacquer is a member selected from the group consisting of polymethyl methacrylate, styrene acrylonitrile, polyethyleneterephthlate and nitrocellulose.

\* \* \* \* \*

UNITED STATES PATENT AND TRADEMARK OFFICE
CERTIFICATE OF CORRECTION

PATENT NO. : 5,643,678
DATED : July 1, 1997
INVENTOR(S) : David R. Boswell

It is certified that error appears in the above-indentified patent and that said Letters Patent is hereby corrected as shown below:

In col. 12, line 7, delete "3" and insert -- 2 --.

Signed and Sealed this

Seventh Day of October, 1997

Attest:

BRUCE LEHMAN

Attesting Officer

Commissioner of Patents and Trademarks